United States Patent
Gurindagunta et al.

(10) Patent No.: US 12,445,146 B2
(45) Date of Patent: Oct. 14, 2025

(54) OFFSET COMPENSATED ANALOG-TO-DIGITAL CONVERTER

(71) Applicant: SEMICONDUCTOR COMPONENTS INDUSTRIES, LLC, Scottsdale, AZ (US)

(72) Inventors: Sundaraiah Gurindagunta, Gollapudi (IN); Parthasarathy V. Sampath, Bangalore (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 160 days.

(21) Appl. No.: 18/517,124

(22) Filed: Nov. 22, 2023

(65) Prior Publication Data

US 2025/0167798 A1 May 22, 2025

(51) Int. Cl.
 *H03M 3/00* (2006.01)
 *H03M 1/12* (2006.01)

(52) U.S. Cl.
 CPC .......... *H03M 3/43* (2013.01); *H03M 1/1245* (2013.01); *H03M 3/428* (2013.01); *H03M 3/456* (2013.01)

(58) Field of Classification Search
 CPC ...... H03M 3/43; H03M 1/1245; H03M 3/428; H03M 3/456
 USPC ........................................ 341/143, 144, 155
 See application file for complete search history.

(56) References Cited

U.S. PATENT DOCUMENTS

| | | | | |
|---|---|---|---|---|
| 6,204,787 B1 * | 3/2001 | Baird | ..................... | H03M 3/488 341/139 |
| 6,707,409 B1 * | 3/2004 | Ignjatovic | ............. | H03M 3/402 341/143 |
| 10,581,453 B1 | 3/2020 | Ganta et al. | | |
| 11,038,522 B1 | 6/2021 | Witte et al. | | |

OTHER PUBLICATIONS

Zhichao Tan, et al., "Incremental Delta-Sigma ADCs: A Tutorial Review", IEEE Transactions On Circuits and Systems—I: Regular Papers, vol. 67, No. 12, Dec. 2020, 13 pages.
Vincent Quiquempoix, et al., "A Low-Power 22-bit Incremental ADC with 4 ppm INL, 2 ppm Gain Error and 2 µV DC Offset", Proceedings of ESSCIRC, Grenoble, France, 2005, 4 pages.

* cited by examiner

*Primary Examiner* — Peguy Jean Pierre
(74) *Attorney, Agent, or Firm* — Brake Hughes Bellermann LLP

(57) ABSTRACT

An oversampling analog-to-digital converter (ADC) may include a quantizer that adds an offset error to each oversampling sample. If not reduced, the offset error may limit the performance of the ADC. The existing methods to eliminate the offset may increase a circuit size and slow the operation of the ADC. An oversampling ADC that can reduce, or remove, the offset error is disclosed. The disclosed ADC can be small and fast and still remove the offset. Accordingly, the disclosed ADC may be used in high performance applications, such as a high-speed image sensor.

20 Claims, 8 Drawing Sheets

OFFSET COMPENSATED ANALOG-TO-DIGITAL CONVERTER

FIELD OF THE DISCLOSURE

The present disclosure relates to an analog-to-digital converter (ADC) and more specifically to an oversampling ADC with logic and circuitry to reduce an offset voltage.

BACKGROUND

Sigma-delta ADCs may provide higher resolution and lower noise than other ADC types because they utilize oversampling. Oversampling includes sampling an input signal at a frequency that is higher than required (i.e., Nyquist frequency) to obtain a stream of samples and then filtering and downsampling (i.e., decimating) the stream of samples to generate output samples at the output of the sigma-delta ADC.

SUMMARY

Generating the stream of (oversampling) samples may include a comparator with a voltage offset (i.e., input offset voltage) that can create errors stream of samples which can reduce the precision of the ADC. A need exists for an ADC configured to compensate for the offset voltage in order to increase the precision of the output samples. The disclosed sigma-delta ADC can compensate for the offset voltage using methods and circuitry that are smaller and faster than other approaches.

In some aspects, the techniques described herein relate to a method for compensating for an offset voltage in a sigma-delta ADC, the method including: replacing an input voltage for a first conversion of a set of conversions, at an input of the sigma-delta ADC, with a reference voltage; quantizing the reference voltage, at a quantizer of the sigma-delta ADC, to obtain a dummy sample, the dummy sample including the offset voltage added by the quantizer of the sigma-delta ADC; decoupling a decimation filter of the sigma-delta ADC; generating a feedback voltage, corresponding to the dummy sample, the feedback voltage including the offset voltage; inverting the feedback voltage to generate an inverted feedback voltage; applying the inverted feedback voltage to an integrator of the sigma-delta ADC, the inverted feedback voltage including an inverted offset voltage; and storing the inverted offset voltage in the integrator to generate an offset-charged integrator.

In some aspects, the techniques described herein relate to a method for compensating for an offset error in a sigma-delta ADC: performing a set of conversions to generate an output sample, wherein for a first conversion of the set of conversions, the method includes: replacing an input voltage at an input of the sigma-delta ADC with a reference voltage; bypassing an integrator of the sigma-delta ADC; quantizing the reference voltage, at a quantizer of the sigma-delta ADC, to obtain a dummy sample, the dummy sample including the offset error added by the quantizer of the sigma-delta ADC; and applying the dummy sample to a decimation filter configured to store the offset error to generate an offset-compensated decimation filter, the offset-compensated decimation filter configured to subtract the offset error added by the quantizer of the sigma-delta ADC for conversions other than the first conversion of the set of conversions.

In some aspects, the techniques described herein relate to a sigma-delta ADC including: a sigma-delta modulator including: an integrator configured to store a difference between an input voltage and a feedback voltage; and a quantizer configured to generate an oversampling sample based on an integrator-output voltage of the integrator, the oversampling sample including an offset error; a decimation filter coupled to an output of the sigma-delta modulator and configured to receive the oversampling sample from the quantizer; and control logic configured by instructions and/or logic circuitry to: configure the sigma-delta modulator to perform a set of conversions to generate an output sample; replace, for a first conversion of the set of conversions, the input voltage with a zero voltage; and decouple, for the first conversion of the set of conversions, the decimation filter from the quantizer so that the feedback voltage from the output of the quantizer is an offset voltage corresponding to the offset error, the offset voltage being stored in the integrator.

In some aspects, the techniques described herein relate to a sigma-delta ADC including: a sigma-delta modulator including: an integrator configured to store a difference between an input voltage and a feedback voltage; a quantizer configured to generate an oversampling sample based on an integrator output voltage, the oversampling sample including an offset error; and a digital-to-analog converter in a feedback loop of the sigma-delta modulator, the digital-to-analog converter configured to convert the oversampling sample into the feedback voltage; a decimation filter coupled to an output of the sigma-delta modulator and configured to receive the oversampling sample from the quantizer; and control logic configured by instructions and/or logic circuitry to: configure the sigma-delta modulator to perform a set of conversions; replace, for a first conversion of a set of conversion, the input voltage with a zero voltage; bypass the integrator for the first conversion of the set of conversions so that the quantizer generates a dummy sample based on the zero voltage, the dummy sample including the offset error; and configure the decimation filter to store the offset error to compensate for offset errors added by the quantizer during subsequent conversions of the set of conversions.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

A sigma-delta ADC (i.e., delta-sigma ADC) is an oversampling ADC. The number of oversampling samples for one output sample is known as the oversampling ratio (OSR). A high OSR can provide output samples with a higher resolution (i.e., bit-depth) and a higher signal-to-noise ratio (SNR). A high OSR, however, can result in a reduction in the speed of the sigma-delta ADC, due to the increased number of oversampling samples per output sample. A need exists for an oversampling ADC having a resolution and SNR suitable for high dynamic range signals of an image sensor (e.g., 150 dB for single exposure) and that is also fast enough to handle the frame rates required for image sensing (e.g., 60 frames per second). Additionally, a smaller circuit size could be advantageous for an image sensor having many columns (e.g., 2000 in a 3 megapixel display, 3200 in an 8 megapixel display), each requiring an ADC. The disclosed sigma-delta ADC can provide these advantages and is useful for high-speed applications, such as image sensors.

Figure 1:
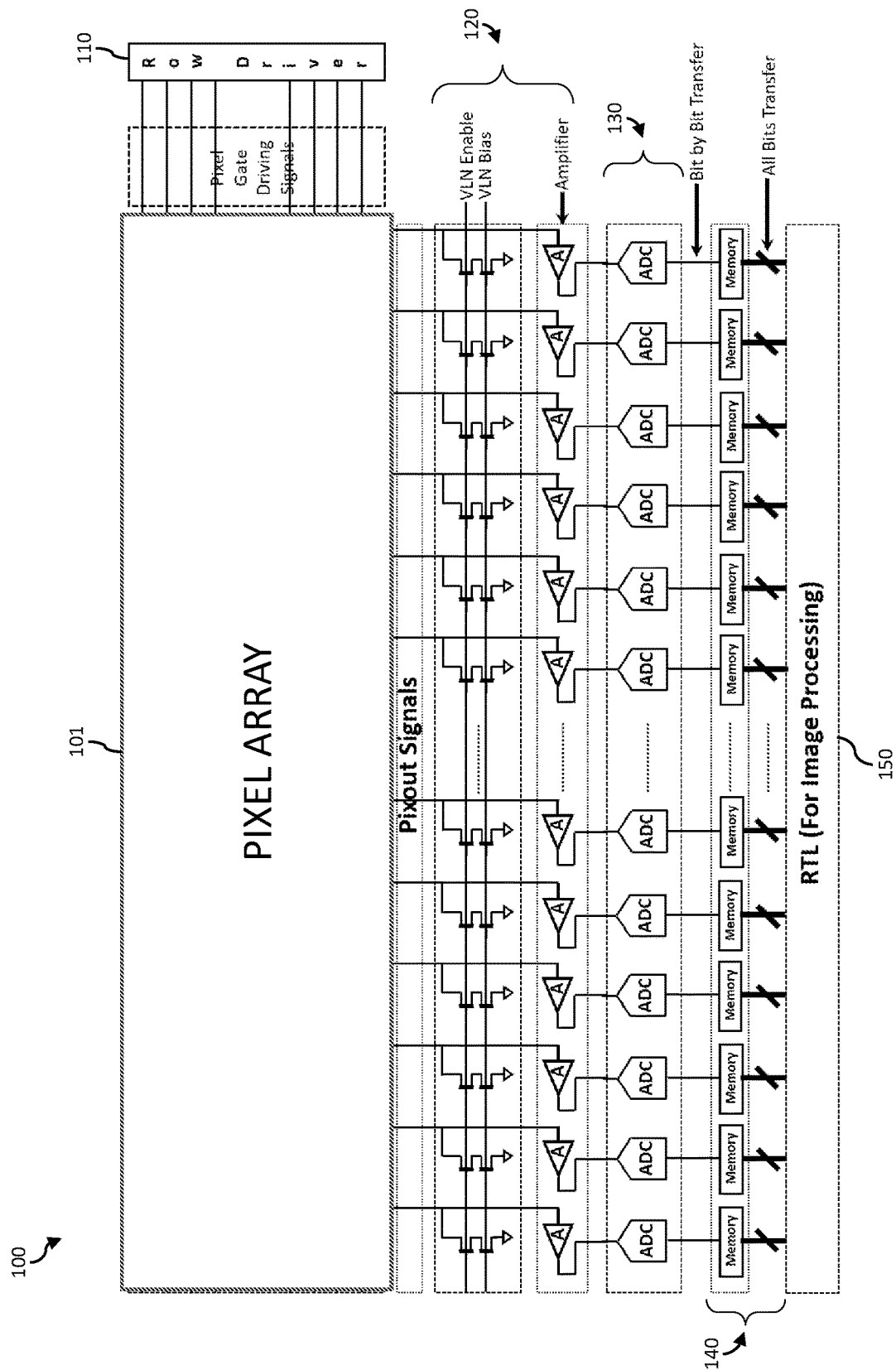
FIG. 1 is a schematic view of an image sensor according to an implementation of the present disclosure.

FIG. 1 is a schematic block diagram of an image sensor according to a possible implementation of the present disclosure. The image sensor 100 includes a pixel array 101 that includes rows and columns of pixels. Each pixel can be configured to store a charge (i.e., voltage) based on an amount of light collected by the pixel. The pixels in the pixel array 101 can be addressed (e.g., read) according to their row/column position to couple the charge stored by the pixel to a column. For example, a row driver 110 may configure each pixel in a row of pixels to couple its charge to a column. Read circuitry 120 for each column may convert the charge to a column voltage, which can be received by an ADC for each column (i.e., column ADC). The column ADCs 130 are configured to convert this voltage into a digital signal, which can then be buffered by memory 140 and transferred to another device (e.g., processor) using register transfer logic 150.

Due to the high frame rate of the image sensor 100, the voltage for a pixel (i.e., pixel voltage) will not change significantly during a conversion performed by a column ADC. Accordingly, the pixel voltage (i.e., input voltage) may be considered as a DC input voltage to the ADC. The ADC may convert this DC voltage (i.e., Vin) into an output sample (i.e., Q (Vin)) on a row-by-row basis (in a time-multiplexed fashion). As a result, the ADC for each column may be an incremental oversampling ADC that can be reset to an initial state after the pixel voltage for each row is converted to an output sample.

Variations in the column ADCs may generate artifacts in a sensed image. For example, if ADCs of a pair of columns have different responses (i.e., different ADC codes) for the same intensity (i.e., input voltage (Vin)) a visible artifact may appear in an image resulting from the image sensor 100. For example, an image of a flat intensity may have vertical lines corresponding to differences in the ADCs for each row. Therefore, reducing or eliminating a variation between the ADCs may be desirable.

One source of variation between ADCs results from an offset voltage (i.e., offset) added by an oversampling ADC during an analog-to-digital conversion. An offset can be defined as a non-zero ADC code that results from a conversion of an input voltage equal to zero (i.e., zero voltage). The offset may arise from fabrication variations (i.e., process corners) for the circuit components. Mitigating the offset variation by design can result in a larger circuit area, which may be undesirable for applications like the image sensor shown in FIG. 1.

Various techniques may be used to reduce the offset in an oversampling ADC. For example, an offset may be reduced by a technique called digital correlated double sampling (DCDS), in which a zero input is converted to obtain a sample of the offset (i.e., offset sample) for the ADC. The offset sample may then be subtracted from subsequent samples to cancel the offset. One technical problem with offset cancellation by DCDS is that it is time consuming. The slow response of DCDS is made worse in oversampling ADCs, which have a throughput that is inversely related to the OSR.

An offset may also be reduced by a technique called chopper stabilization in which an input voltage is modulated so that the offset can be filtered. One technical problem with chopper stabilization is that the circuitry required may be too complex and/or too large for applications like the image sensor shown in FIG. 1.

The disclosed technique is well suited for the image sensor shown in FIG. 1 because it can reduce or eliminate an offset in an oversampling ADC faster than DCDS and with less complexity than chopper stabilization.

Figure 2:
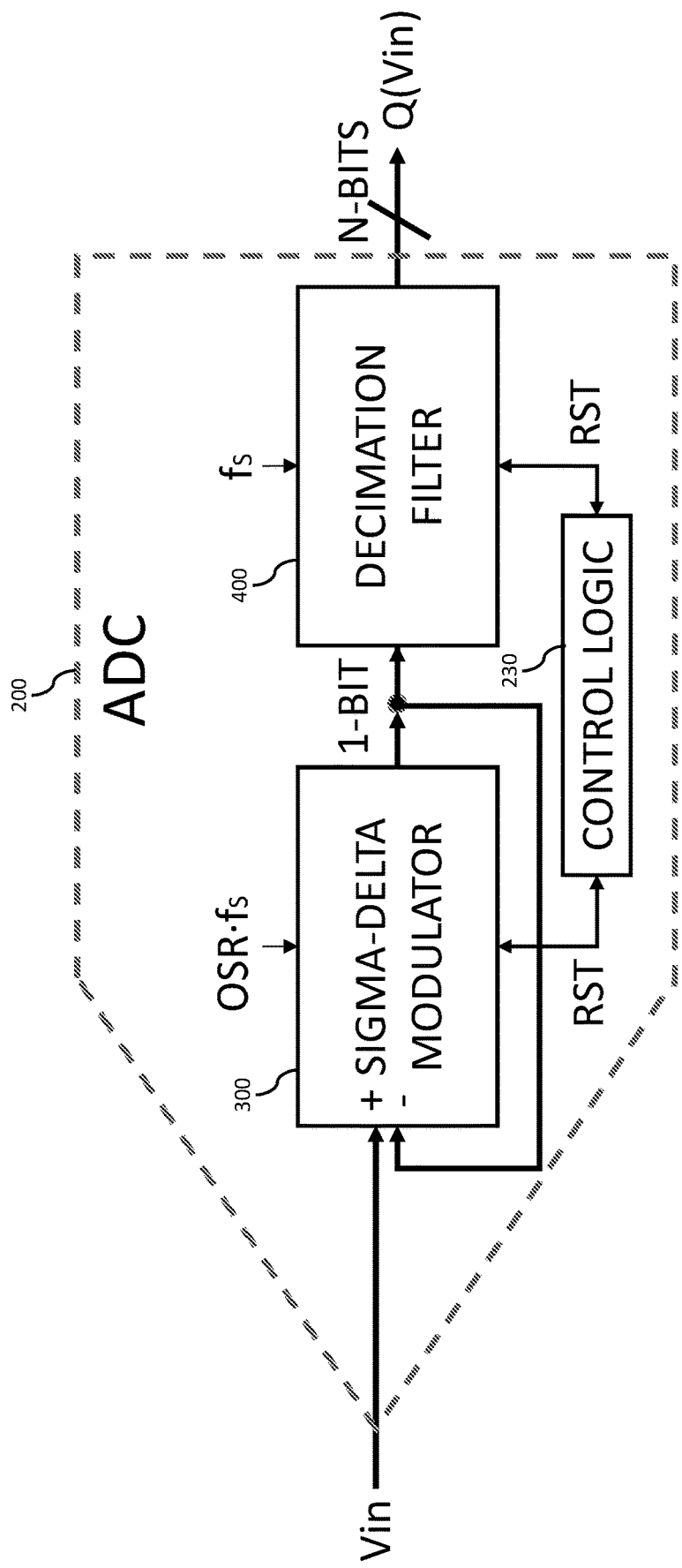
FIG. 2 is a system block diagram of an ADC according to a possible implementation of the present disclosure.

FIG. 2 is a system block diagram of an oversampling ADC 200 according to a possible implementation of the present disclosure. The ADC 200 includes a sigma-delta modulator 300 (i.e., delta-sigma modulator) configured to receive an input voltage Vin at an input of the ADC 200. The ADC 200 further includes a decimation filter 400 (e.g., accumulator) configured to receive oversampling samples from the sigma-delta modulator 300. The decimation filter 400 is further configured to output an output sample at an output of the ADC 200.

The input voltage Vin is an analog signal while the output sample Q (Vin) is an N-bit digital number (e.g., digital word, digital code) corresponding to a relative level of the input voltage within a dynamic range of the ADC. The resolution of the digital representation is related to the least significant bit (LSB), which is the dynamic range divided by the number of bits (N) in the digital word.

The sigma-delta modulator 300 is configured to encode an input signal Vin into a low-bit depth (e.g., 1-bit) bit-stream. The bit stream may be fed back to the input as negative feedback to correct for quantization errors and shape (i.e., shift) the noise (e.g., quantization noise) to higher frequencies. The bit-stream is also low-pass filtered through a decimation filter 400 to remove its high frequency noise and average the bit-stream over time to achieve a high-accuracy (N-bit) measurement of the amplitude of the input signal.

The decimation filter 400 outputs the output sample at a resolution (bit-depth) that is higher than the resolution of each oversampling sample. For example, each oversampling sample may be a 1-bit sample that is either HIGH (e.g., 1) or LOW (e.g., 0) based on an error signal between the input Vin and a negative (i.e., inverted) feedback signal. Accordingly, the decimation filter 400 may be configured to accumulate the oversampling samples in order to generate a higher resolution (N-bit) signal at the end of a set of oversampling conversions.

The output sample Q (Vin) is generated based on a number (i.e., OSR) of oversampling samples. Accordingly, the sigma-delta modulator 300 may be configured to perform oversampling conversions (i.e., conversions) at a rate (OSR·fs) that is higher than the rate (fs) that the output samples are generated. In other words, a set of conversions may be performed to generate one output sample. For example, multiple conversions may be performed by the sigma-delta modulator 300 from the decimation filter 400.

The ADC 200 further includes control logic 230. The control logic 230 may include a controller, processor, and/or logic circuitry (such as logic gates, registers, etc.) that manage the flow and operation of the oversampling conversion process. For example, the control logic 230 may couple the input signal to the sigma-delta modulator 300 (i.e., sample the input signal) at the rate (fs) that each output sample is generated. The control logic 230 may be configured by instructions (e.g., programming code) and/or logic circuitry to perform a method to generate an output sample based on the input voltage. In particular, the method can include steps to compensate for an offset voltage generated by circuitry in the ADC 200.

The ADC 200 may be implemented as an incremental sigma-delta ADC in which the storage elements of the sigma-delta modulator 300 and/or the decimation filter 400 are reset (i.e., cleared) after each output sample is generated. Accordingly, the control logic 230 may be configured to transmit a reset signal (RST) to the sigma-delta modulator 300 and/or the decimation filter 400 before starting a new oversampling set of conversions.

Figure 3:
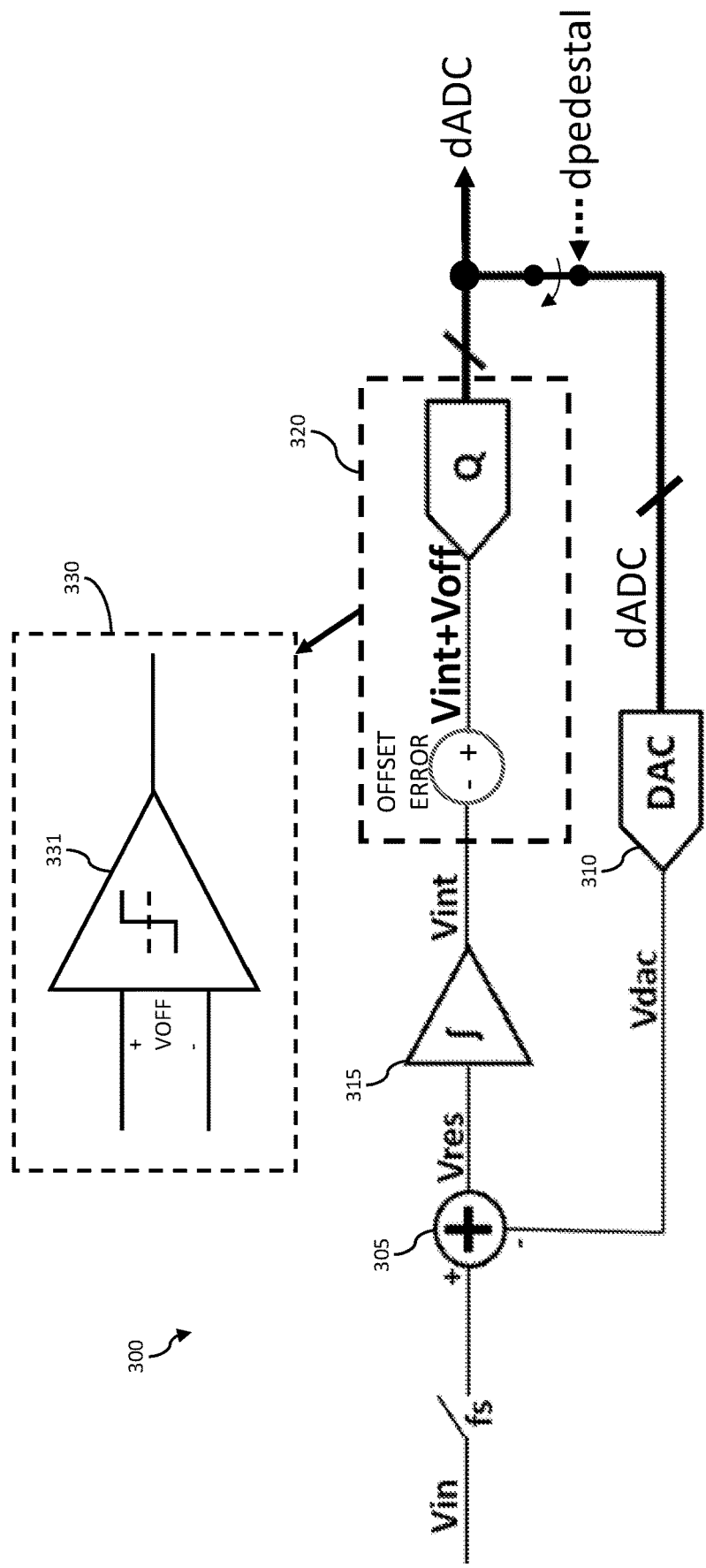
FIG. 3 schematically illustrates a sigma-delta modulator for an ADC according to a possible implementation of the present disclosure.

FIG. 3 illustrates a sigma-delta modulator 300 according to a possible implementation of the present disclosure. The sigma-delta modulator 300 includes a summer 305 configured to invert a feedback voltage (Vdac) generated by a digital-to-analog converter 310 based on the latest oversampling sample (dADC). The summer 305 is further configured to sum the inverted feedback voltage and the input voltage to generate a residual voltage (Vres). In other words, the residual voltage Vres is the difference between the input voltage Vin and the feedback voltage Vdac.

The sigma-delta modulator 300 further includes an integration stage (i.e., integrator 315). Only one integrator is shown because the sigma-delta modulator 300 is first order, though the disclosed techniques could be used with higher order ADCs. The integrator 315 is configured to integrate (i.e., store) the residual voltage. Accordingly, the integrator may include a storage element, such as a capacitor, to store the residual voltage. The integrator may be reset after a set of conversions by draining the charge from the capacitor. Each conversion in a set of conversions for oversampling may include the residual signal passing through the integrator 315. In other words, each conversion may be one feedback loop iteration. The output voltage of the integrator, or integrator-output voltage, is shown in FIG. 3 as Vint.

The storage quality of the integrator 315 allows for a voltage stored by the integrator 315 on a first conversion to have an effect on each subsequent conversion in a set of conversions for oversampling (i.e., OSR conversions). Accordingly, the first conversions of a set of conversions may be used to initialize certain voltages for the remaining conversions in an oversampling set. As shown, a pedestal voltage based on a pedestal signal (dpedestal) may be added as negative feedback on a first conversion in order to bias (i.e., lift) a negative input voltage to a positive input voltage. Because the pedestal voltage is stored in the integrator, this injection of the pedestal signal dpedestal, which includes decoupling the output from the feedback, may only occur at the start of a set of oversampling conversions.

The sigma-delta modulator 300 further includes a quantizer 320 configured to digitize the integrated signal. As shown, the quantizer 320 can be configured to generate a digital 1-bit oversampling sample dADC based on an integrator-output voltage Vint, which is transmitted to the quantizer 320 by the integrator 315. As shown in the inset 330, the quantizer 320 may be implemented as a comparator 331. The comparator 331 is configured to compare the integrator-output voltage Vint to a threshold and to output a HIGH voltage or a LOW voltage corresponding to a 1-bit digital signal based on the comparison. Undesirably, the comparator 331 can add an offset voltage Voff to the integrator-output voltage Vint. The offset may prevent the quantizer 320 from accurately digitizing the integrator-output voltage Vint for some values. In other words, because of the offset, the conversions may include offset errors.

The sigma-delta modulator 300 disclosed here can measure the offset voltage Voff added by the quantizer 320 on a first oversampling conversion of a set of oversampling conversions. The offset voltage Voff can then be stored in the integrator 315 (e.g., as a charged capacitor) to form an offset-charged integrator. The offset-charged integrator is then configured with a voltage to compensate for (e.g., cancel) the offset voltage Voff added by the quantizer 320 in subsequent conversions of the set of oversampling conversions.

The first sample generated by the first conversion may not be coupled to the decimation filter 400 and so is not accumulated as part of the output sample. Accordingly, in this implementation, the first sample may be referred to as a dummy sample, as its purpose is to measure and store the offset. Samples other than the first sample (i.e., subsequent samples) may be referred to as oversampling samples because they are accumulated by the decimation filter 400 in order to generate an output sample.

Figure 4:
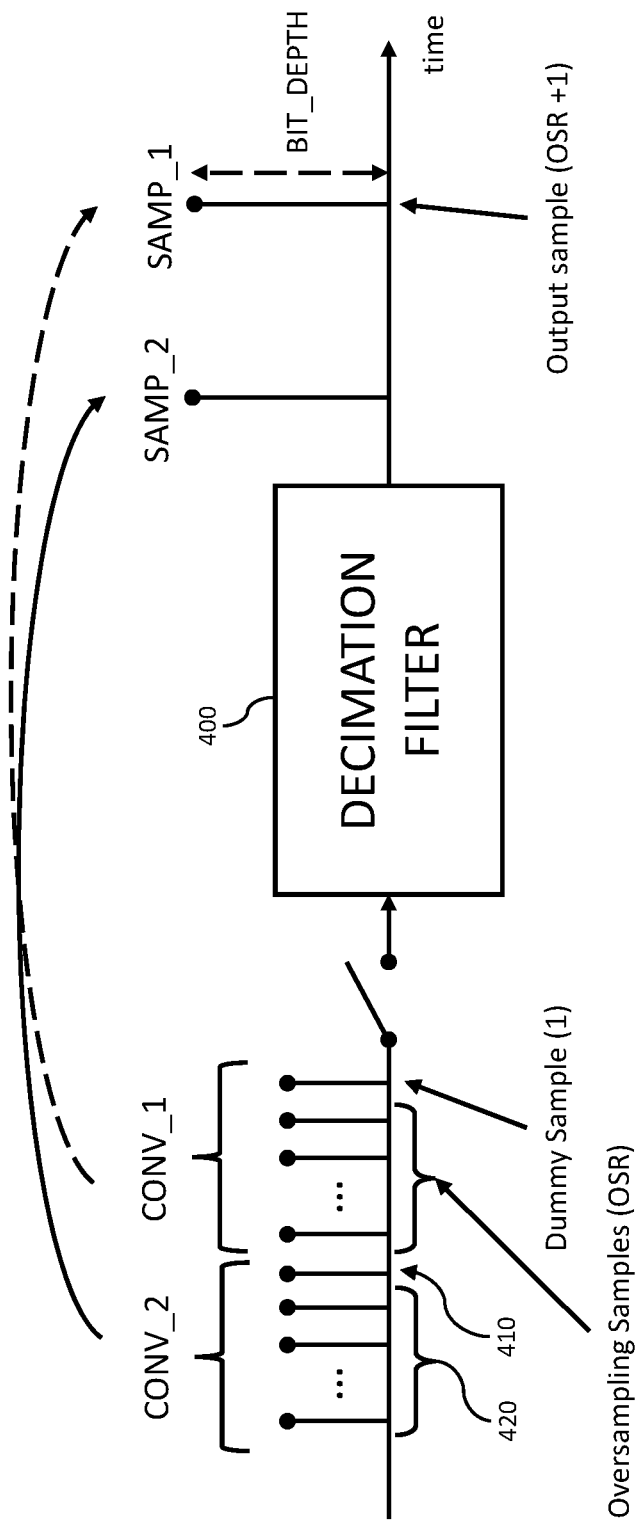
FIG. 4 illustrates the operation of a decimation filter for an ADC according to a possible implementation of the present disclosure.

FIG. 4 illustrates the operation of a decimation filter 400 for an ADC according to a possible implementation of the present disclosure. As shown, the decimation filter 400 receives oversampling samples at its input and transmits output samples at its output. The oversampling samples have a lower resolution (i.e., bit depth) than the output samples. For example, the oversampling samples may form a digital bit stream.

The oversampling samples may be grouped into sets of conversions corresponding to the output samples. As shown, a first set of conversions (CONV_1) corresponds to a first output sample (SAMP_1) and a second set of conversions (CONV_2) corresponds to a second output sample (SAMP_2). The first conversion of each set of conversions results in a dummy sample. For example, the first conversion of the second set CONV_2 is dummy sample 410, and all subsequent conversions of the second set CONV_2 are oversampling samples 420. The dummy sample is not coupled to the decimation filter 400. The dummy sample is used to generate an offset-charged integrator. The subsequent conversions of each set of conversions result in oversampling samples. The oversampling samples are coupled to the decimation filter 400. The output samples may correspond with multiple oversampling samples accumulated at the decimation filter. As such, output samples, such as SAMP_1 and SAMP_2, are output at a lower frequency than the oversampling conversions.

The first conversion (i.e., dummy sample) is used to compensate for the offset voltage associated with each subsequent conversion (i.e., oversampling samples). Accordingly, while the output sample is delayed by the additional dummy sample, the output sample may have little to no offset error. Because the rate of the oversampling conversions can be fast, this delay can be relatively small (e.g., 350 nanoseconds).

This offset reduction technique is very versatile and can be combined with other techniques to improve performance. For example, increasing the number (OSR) can increase the resolution of the output sample but may limit the speed of the ADC. Additionally or alternatively, a successive-approximation-register (SAR) can be used in the oversampling loop of the ADC to increase the resolution of an oversampling ADC without increasing its OSR. The SAR uses a binary search algorithm and a bank of capacitors to determine bits for the ADC. Accordingly, the disclosed ADC may utilize a SAR conversion algorithm, which is well suited for a high-resolution image sensor, such as shown in FIG. 1.

Figure 5:
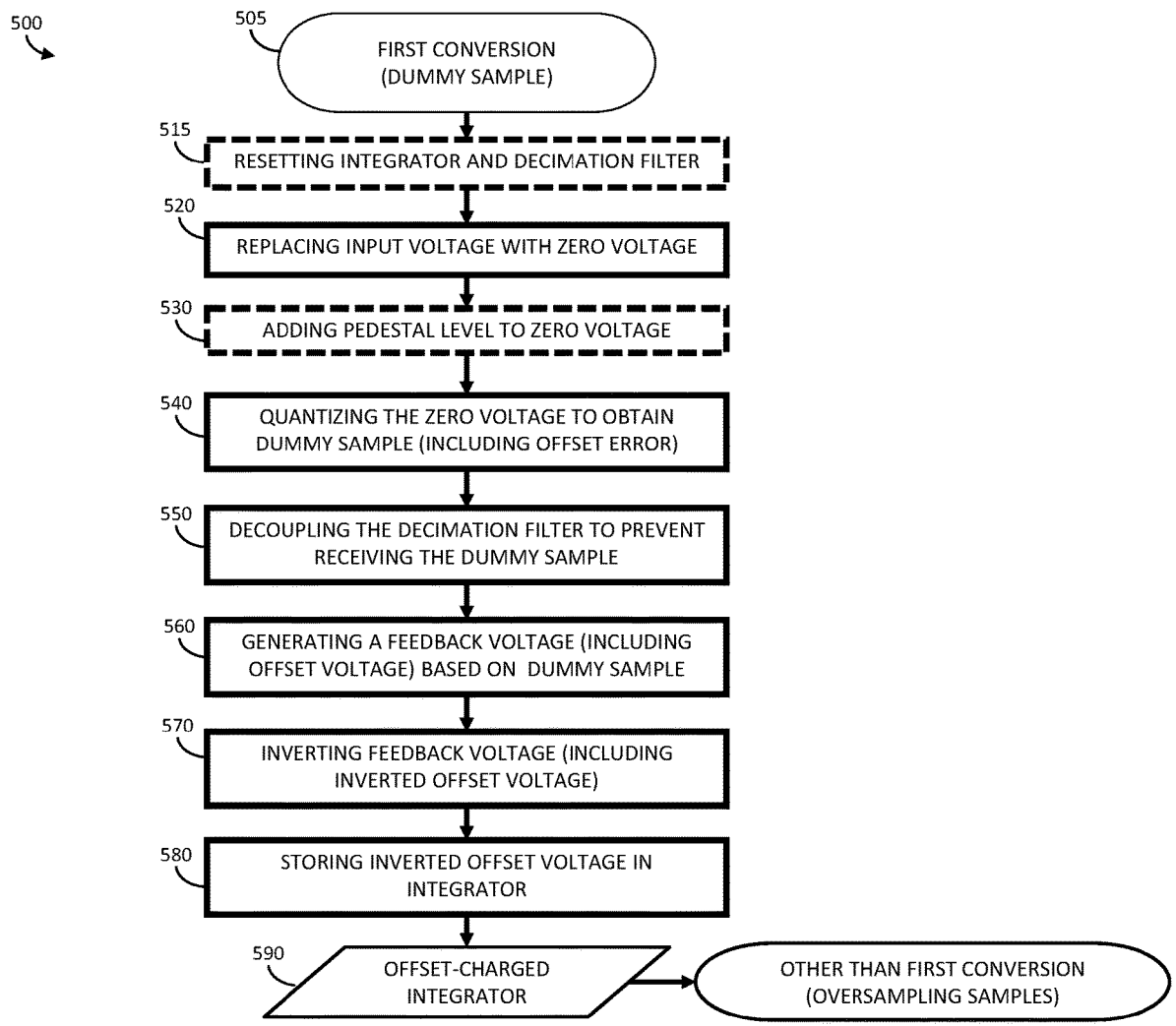
FIG. 5 is a flowchart for a method to generate an offset-charged integrator to compensate for an offset voltage according to a possible implementation of the present disclosure.

FIG. 5 is a flowchart for a method to generate an offset-charged integrator to compensate for an offset voltage in a sigma-delta ADC. The method 500 is performed for (e.g., only for) a first conversion of a set of conversions for generating an output sample. In other words, the method 500 is performed for a first conversion 505 corresponding to the dummy sample.

The method 500 can include resetting 515 the integrator of the sigma-delta modulator so that it is not charged with an offset from a previous output sample. Other circuitry may be reset as well, for example the decimation filter may be reset. For example, values stored in the decimation filter can be reset (e.g., to zero) so that oversampling samples accumulated for any previous output sample are not included in the accumulator with the oversampling samples from the current output sample.

The method 500 further includes replacing 520 an input voltage Vin with a reference voltage. The reference voltage may be zero volts or a zero voltage, or may be a nonzero voltage. The step of replacing may include controlling one or more switches to decouple the input voltage from an input of the sigma-delta modulator. The step of replacement may further include controlling the one or more switches to couple the input of the sigma-delta modulator to a ground or a reference voltage.

In a possible implementation, the method 500 further includes adding 530 a pedestal level to the reference voltage. As shown in FIG. 3, the pedestal level (i.e., dpedestal) may be a digital signal applied to the digital-to-analog converter 310 of the feedback loop of the sigma-delta modulator 300 so that it can be combined with the reference voltage at the input of the sigma-delta modulator 300 and stored in the integrator 315. In other words, the offset-charged integrator may further store a pedestal level. Resetting 515 the integrator can also clear the pedestal value from the integrator. Accordingly, the pedestal level can be added once (e.g., during the dummy sample conversion) for each output sample.

The method 500 further includes quantizing 540 the reference voltage to obtain a dummy sample. Quantizing comprises digitizing the reference voltage. As shown in FIG. 4, the dummy sample corresponds to the first conversion of a set of conversions for an output sample, and each output sample has a corresponding dummy sample. The dummy sample is a conversion to sense (e.g., measure) an offset voltage. Accordingly, the dummy sample can be a digital value (dADC) that represents the offset voltage added by the quantizer 320 of sigma-delta ADC. The digital value of the dummy sample does not represent the input voltage, however, because the input voltage is replaced by a reference voltage (e.g., zero volts) for the dummy sample conversion. Accordingly, the dummy sample is not accumulated to determine an output sample. Therefore, the method 500 further includes decoupling 550 the decimation filter 400 so that the dummy sample is not received by the decimation filter of the sigma-delta ADC. In some implementations, the decoupling 550 step may be performed any time earlier in the process.

The method 500 further includes generating 560 a feedback voltage (Vdac) based on the dummy sample. The feedback voltage (Vdac) is an analog voltage converted from the dummy sample by the digital-to-analog converter 310 in the feedback loop of the sigma-delta modulator 300. The feedback voltage includes the offset voltage corresponding to an offset error added by the quantizer 320. The feedback voltage (Vdac) also includes a quantization voltage corresponding to a quantization error added by the digital-to-analog converter 310.

The method 500 further includes inverting 570 the feedback voltage to generate an inverted feedback voltage (−Vdac). The inverted feedback voltage (−Vdac) includes an inverted offset voltage (−Voffset).

The method 500 further includes storing 580 the inverted offset voltage (−Vdac) in the integrator 315 to generate an offset-charged integrator 590. The offset-charged integrator 590 is configured to add the inverted offset voltage (−Voffset) to an output of the integrator (Vint). The offset-charged integrator adds the inverted offset voltage (−Voffset) to compensate (i.e., cancel, negate, zero) the offset voltage (+Voffset) added by the quantizer in subsequent conversions. After the offset-charged integrator is generated, a method for generating oversampling samples using the offset-charged integrator may begin (see FIG. 6).

Figure 6:
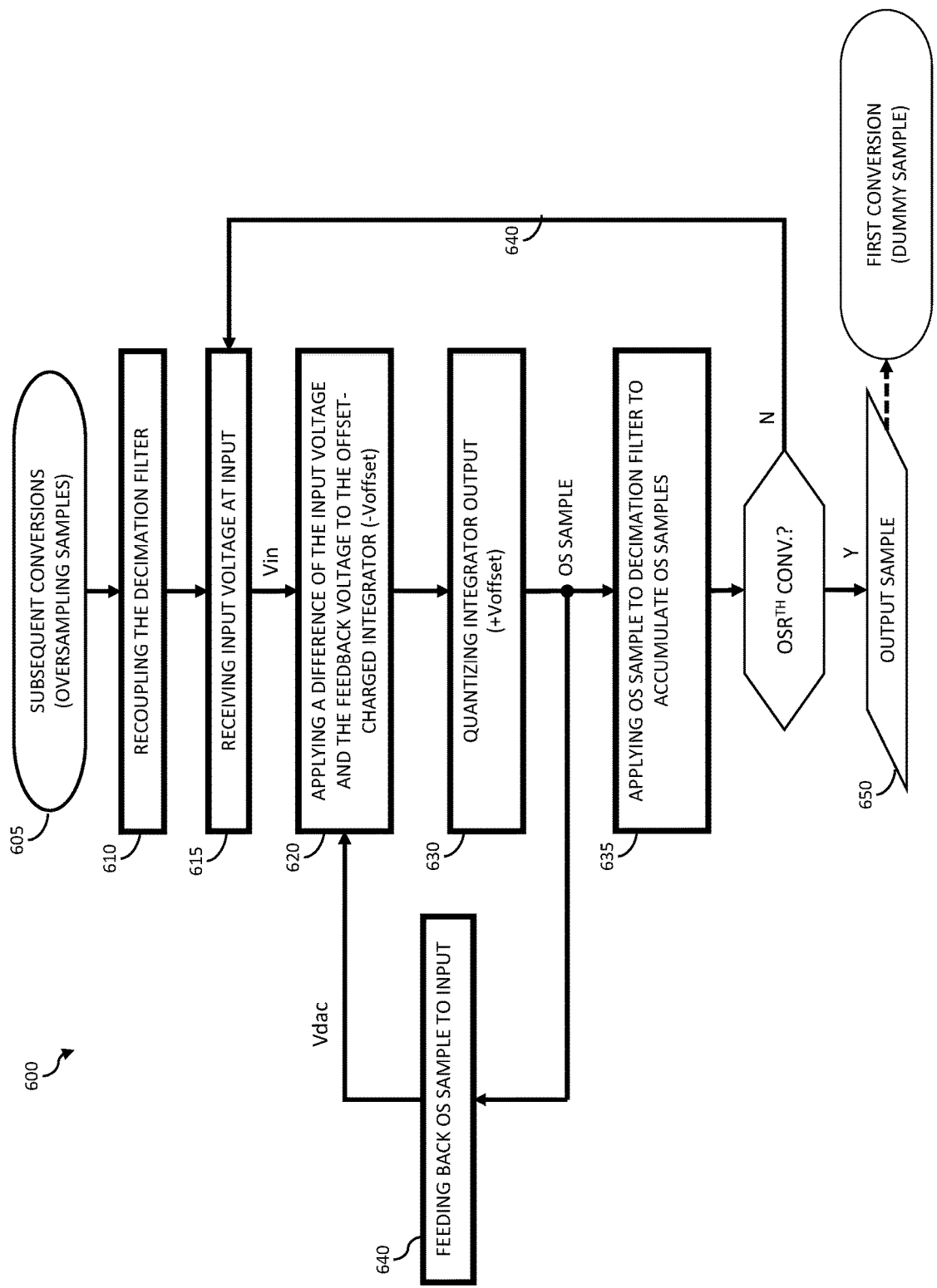
FIG. 6 is a flowchart for a method to generate an output sample with an offset-charged integrator according to a possible implementation of the present disclosure.

FIG. 6 is a flowchart for a method to generate an output sample with an offset-charged integrator according to a possible implementation of the present disclosure. The method 600 is performed for (e.g., only for) conversions of the set of conversions other than the first conversion (i.e., subsequent to the first conversion). In other words, the method 600 is performed for the subsequent conversions 605 corresponding to oversampling (i.e., OS) samples.

The method 600 includes recoupling 610 the decimation filter 400 to the output of the sigma-delta modulator 300 so that each oversampling sample after the dummy sample can be accumulated by the decimation filter.

The method 600 further includes receiving 615 an input voltage Vin at the input of the ADC. The input voltage is combined with negative feedback from the output of the quantizer 320. For example, a summing circuit (e.g., summer 305) may add the input voltage (Vin) with an inverted feedback voltage (−Vdac). In other words, the method 600 includes applying 620 the difference of the input voltage and the feedback voltage (i.e., Vin-Vdac) to the offset-charged integrator.

The method 600 further includes quantizing 630 the output of the offset-charged integrator (i.e., integrator output) to generate an oversampling sample (i.e., OS sample). The OS sample may have less offset error (e.g., no offset error) because the inverted offset voltage stored in the offset-charged integrator cancels the (non-inverted) offset voltage added by the quantizer 320.

The method 600 further includes applying 635 the OS sample to the decimation filter 400 configured to accumulate the OS samples as they are generated over iterations of the oversampling conversions in the set of conversions.

The method 600 may be repeated 640 for a number (OSR) iterations in the set of conversions in order to generate a time sequence of OS samples. The sequence of OS samples may be filtered and down sampled by the decimation filter 400 to generate an output sample 650 after the OSR$^{th}$ conversion.

After the method 600 has generated the output sample 650, the method to generate an offset-charged integrator (see FIG. 5) may be restarted for a subsequent (the next) output sample. In other words, after the output sample has been generated by a first set of conversions, a second set of conversions may begin to generate a second output sample, and so on.

Compensation for the offset added by the quantizer can be carried in an analog domain, such as described thus far, with the integrator of the sigma-delta modulator serving as a means for storing an analog voltage corresponding to the offset. In this implementation, an inverted offset voltage is stored in the integrator and added at an input of the quantizer to cancel the (non-inverter) offset added by the quantizer.

In alternative implementation, the compensation for the offset can be carried out in a digital domain. In this implementation, a digital offset error is stored in the decimation filter (e.g., accumulator) in a first conversion. In subsequent conversions, the decimator is configured to subtract the stored offset error from an output of the quantizer in order to cancel the offset error added by the quantizer.

Figure 7:
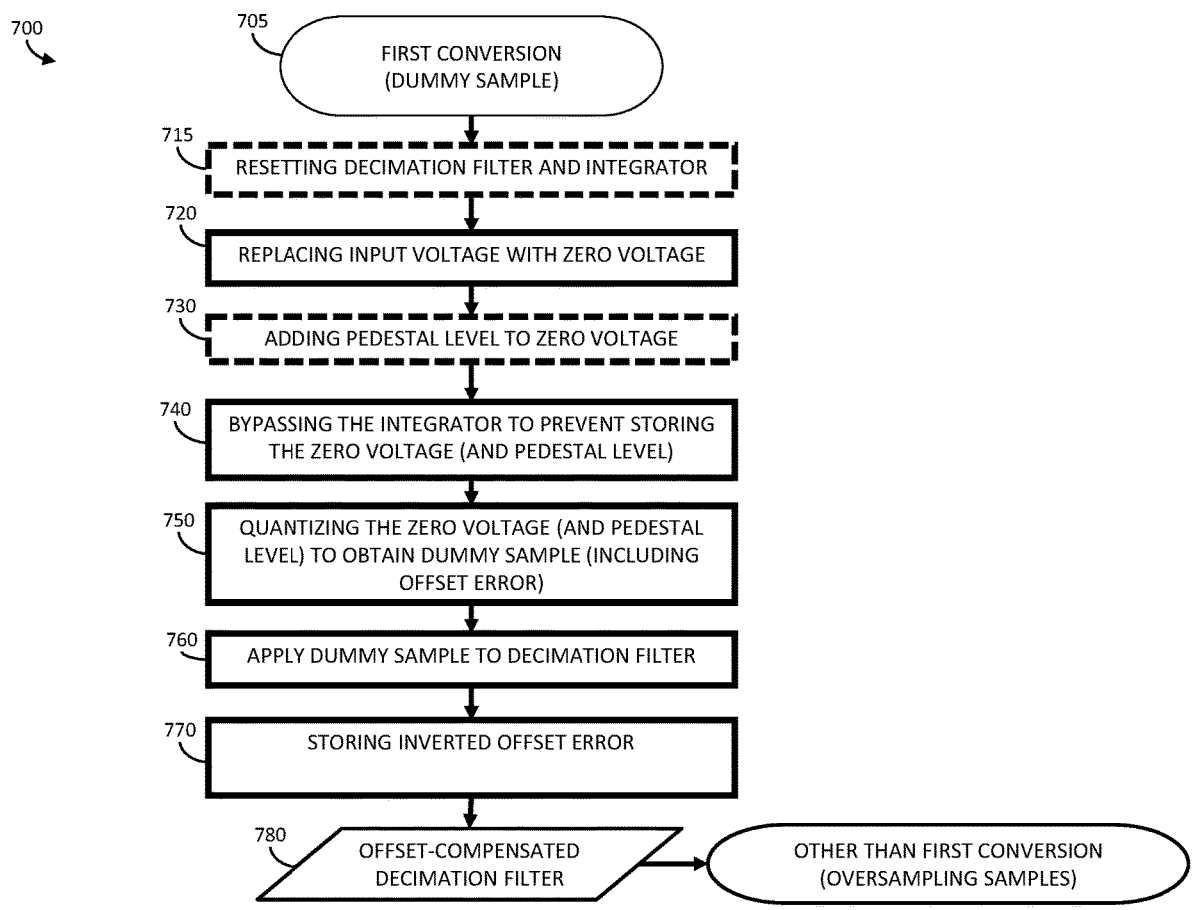
FIG. 7 is a flowchart for a method to generate an offset-compensated decimation filter to compensate for an offset voltage according to a possible implementation of the present disclosure.

FIG. 7 is a flowchart for a method to generate an offset-compensated decimation filter to compensate for an offset error in a sigma-delta ADC. The method 700 is performed for (e.g., only for) a first conversion of a set of conversions for generating an output sample. In other words, the method 700 is performed for a first conversion 705 corresponding to a dummy sample.

The method 700 includes resetting 715 the decimation filter 400. The decimation filter can be reset by clearing values stored in the decimation filter 400 so that oversampling samples, which were accumulated for a previous output sample, are not included with the oversampling samples from the current output sample. Other circuitry may be reset as well, for example the integrator 315 of the sigma-delta modulator can be reset so that it is not charged with an offset or other signal (e.g., pedestal, quantization error, etc.) from any previous output sample.

The method 700 further includes replacing 720 an input voltage (i.e., Vin) with a reference voltage. The reference voltage may be zero volts, or a zero voltage, or may be a nonzero voltage. The step of replacing may include controlling one or more switches to decouple the input voltage from an input of the sigma-delta modulator. The step of replacement may further include controlling the one or more switches to couple the input of the sigma-delta modulator to a ground or a reference voltage.

The method 700 further includes adding 730 a pedestal level to the zero voltage. As shown in FIG. 3, the pedestal level (i.e., dpedestal) may be a digital signal applied to the digital-to-analog converter 310 of the feedback loop of the sigma-delta modulator 300 so that it can be combined with the reference voltage at the input of the sigma-delta modulator 300.

The method 700 further includes bypassing 740 the integrator 315 to prevent it from storing the reference voltage and the pedestal level. Bypassing 740 the integrator may include passing the reference voltage and pedestal level through the integrator but not storing these voltages. Alternatively, bypassing the integrator may include disabling the function of the integrator and/or routing the signals around in a path (e.g., short circuit) around the integrator 315 so that the reference voltage and/or a pedestal voltage are not stored in the integrator 315. Disabling the function of the integrator may advantageously save power that would otherwise be used by the integrator during the (first) conversion corresponding to the dummy sample.

The method 700 further includes quantizing 750 the reference voltage and pedestal level to obtain a dummy sample. Accordingly, the dummy sample is a digital value (dADC) that represents the offset error added by the quantizer 320 of sigma-delta ADC. The digital value (dADC) of the dummy sample does not include an input voltage because the input voltage is replaced by a reference voltage for the dummy sample conversion. Accordingly, the dummy sample may correspond to (e.g., equal) the offset error.

The method 700 further includes applying 760 the dummy sample (dADC) to the decimation filter 400. In other words, the decimation filter 400 can be configured to store the offset error added by the quantizer 320. The decimation filter 400 is not decoupled from the signal path during the dummy sample because, in this implementation, the decimation filter 400 is used as the storage element. Accordingly, the method 700 further includes storing 770 the offset error to generate an offset-compensated decimation filter 780. The offset-compensated decimation filter is configured to compensate for (e.g., eliminate) the offset errors added by the quantizer during subsequent conversions using the stored offset error. A method for generating oversampling samples using the offset-compensated decimation filter (see FIG. 8) may begin after the offset-compensate decimation filter is generated.

Figure 8:
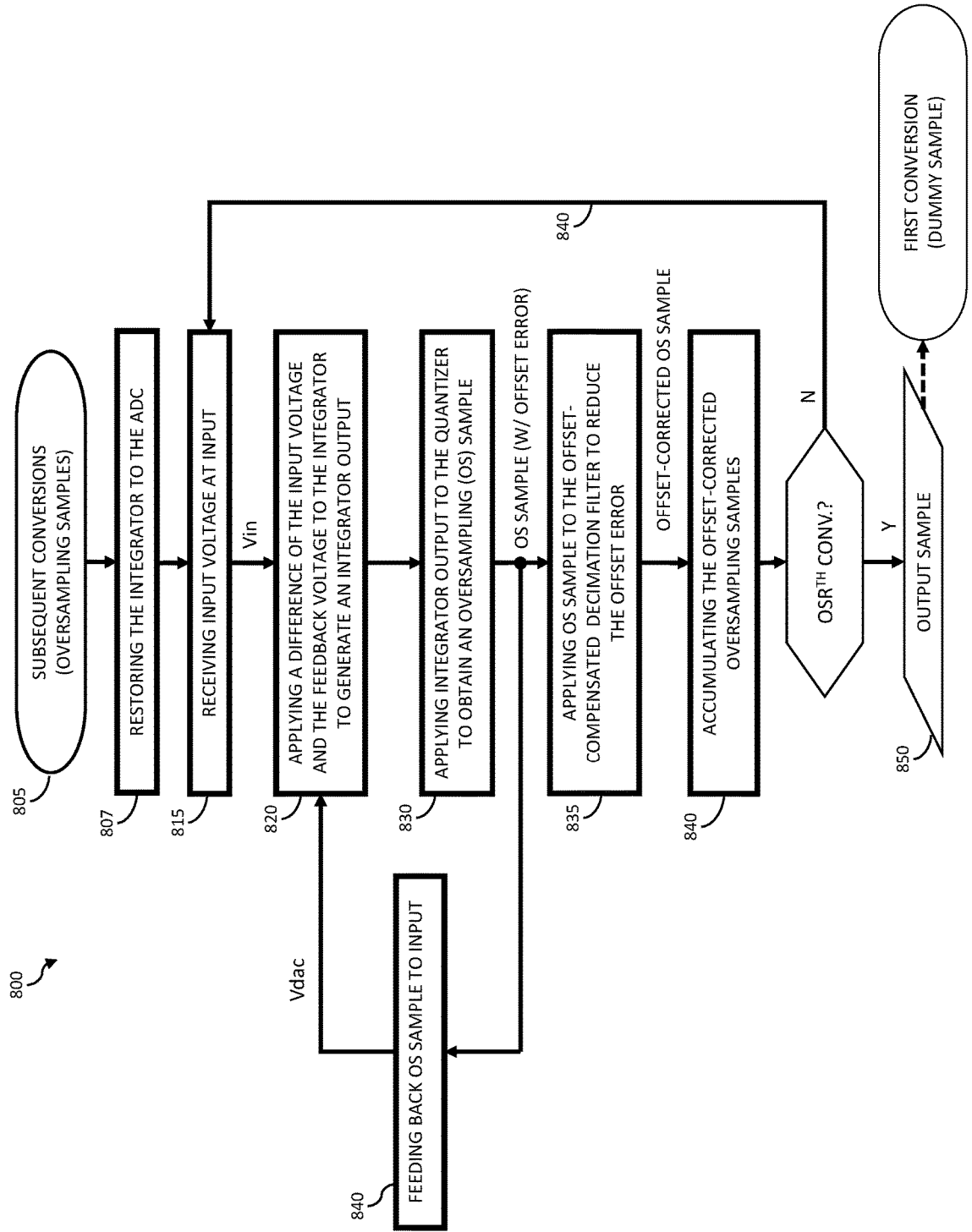
FIG. 8 is a flowchart for a method to generate an output sample with an offset-compensated decimation filter according to a possible implementation of the present disclosure.

FIG. 8 is a flowchart for a method to generate an output sample with an offset-compensated decimation filter according to a possible implementation of the present disclosure.

The method 800 is performed for (e.g., only for) a conversion of the set of conversions other than the first conversion. In other words, the method 800 is performed for all conversions of the set of conversions except for the first conversion. In other words, the method 800 is performed for the subsequent conversions 805 corresponding to oversampling samples. After the first conversion, the method 800 includes restoring 807 (i.e., reactivating, recoupling) the integrator, which was bypassed during the dummy sample process (e.g., see FIG. 7, step 740), to the ADC.

The method 800 includes receiving 815 an input voltage (Vin) at the input of the ADC. The input voltage is combined with negative feedback from the output of the quantizer 320. For example, a summing circuit (i.e., summer 305) may add the input voltage (Vin) with an inverted feedback voltage (−Vdac).

The method 800 further includes, applying 820 the difference of the input voltage and the feedback voltage to the integrator to generate an integrator output at an output of the integrator 315.

The method 800 further includes applying 830 (i.e., inputting, transmitting, etc.) the integrator output to the quantizer to generate an oversampling sample. The oversampling sample includes an offset error added by the quantizer. Accordingly, the method 800 further includes applying 835 the oversampling sample to the offset-compensated decimation filter. The offset-compensated decimation filter is configured to reduce (e.g., remove) the offset error from the oversampling sample to generate an offset-corrected oversampling sample.

The method 800 is further includes accumulating the offset-corrected oversampling samples in the offset-compensated decimation filter until a OSR number of oversampling samples in a set of conversions are accumulated. Accordingly, the method 800 may be repeated 840 for a number (OSR) iterations in the set of conversions in order to generate a time sequence of OS samples. The sequence of OS samples may be filtered and down-sampled by the decimation filter 400 to generate an output sample 850 after the OSR$^{th}$ conversion.

After the method 800 has generated the output sample 850, the method to generate an offset-compensated decimation filter (see FIG. 7) may be restarted for a subsequent (the next) output sample. In other words, after the output sample has been generated by a first set of conversions, a second set of conversions may begin to generate a second output sample, and so on.

In the following some examples of the disclosure are described.

Example 1. A method for compensating for an offset voltage in a sigma-delta ADC, the method comprising: replacing an input voltage for a first conversion of a set of conversions, at an input of the sigma-delta ADC, with a reference voltage; quantizing the reference voltage, at a quantizer of the sigma-delta ADC, to obtain a dummy sample, the dummy sample including the offset voltage added by the quantizer of the sigma-delta ADC; decoupling a decimation filter of the sigma-delta ADC; generating a feedback voltage, corresponding to the dummy sample, the feedback voltage including the offset voltage; inverting the feedback voltage to generate an inverted feedback voltage; applying the inverted feedback voltage to an integrator of the sigma-delta ADC, the inverted feedback voltage including an inverted offset voltage; and storing the inverted offset voltage in the integrator to generate an offset-charged integrator.

Example 2. The method according to example 1, wherein: the set of conversions are performed to generate an output sample; and for conversions other than the first conversion of the set of conversions, the inverted offset voltage added by the offset-charged integrator cancels the offset voltage added by the quantizer while generating the output sample.

Example 3. The method according to example 2, wherein the set of conversions is a first set of conversions and the output sample is a first output sample, and wherein after performing the first set of conversions to generate the first output sample, the method further comprises: resetting the offset-charged integrator by clearing the inverted offset voltage before starting a second set of conversions to generate a second output sample; and generating a second offset-charged integrator for the second set of conversions.

Example 4. The method according to example 3, wherein performing the set of conversions to generate the output sample further includes: receiving the input voltage at the input of the sigma-delta ADC; applying the input voltage to the offset-charged integrator; applying an integrator output of the offset-charged integrator to the quantizer, the integrator output including the inverted offset voltage to cancel the offset voltage added by the quantizer; generating an oversampling sample, the oversampling sample having no offset error; and applying the oversampling sample to the decimation filter.

Example 5. The method according to any one of examples 2 to 4, wherein: the first conversion of the set of conversions is the dummy sample, which is not accumulated by the decimation filter; and conversions other than the first conversion of the set of conversions are oversampling samples that are accumulated by the decimation filter.

Example 6. The method according to example 5, wherein: storing the inverted offset voltage stored in the integrator is based on the dummy sample and not the oversampling samples.

Example 7. The method according to example 5 or 6, further comprising: outputting the output sample corresponding to the input voltage at an output of the decimation filter is based on the oversampling samples and not the dummy sample.

Example 8. The method according to any one of the preceding examples, wherein for the first conversion of the set of conversions, the method further includes: adding a pedestal voltage to the reference voltage; and storing the pedestal voltage in the integrator with the inverted offset voltage.

Example 9. The method according to example 8, further comprising: not adding the pedestal voltage to conversions other than the first conversion of the set of conversions.

Example 10. The method according to any one of the preceding examples, wherein the reference voltage is zero volts.

Example 11. A method for compensating for an offset error in a sigma-delta ADC: performing a set of conversions to generate an output sample, wherein for a first conversion of the set of conversions, the method includes: replacing an input voltage at an input of the sigma-delta ADC with a reference voltage; bypassing an integrator of the sigma-delta ADC; quantizing the reference voltage, at a quantizer of the sigma-delta ADC, to obtain a dummy sample, the dummy sample including the offset error added by the quantizer of the sigma-delta ADC; and applying the dummy sample to a decimation filter configured to store the offset error to generate an offset-compensated decimation filter, the offset-compensated decimation filter configured to subtract the offset error added by the quantizer of the sigma-delta ADC for conversions other than the first conversion of the set of conversions.

Example 12. The method according to example 11, wherein the set of conversions is a first set of conversions an the output sample is a first output sample, and wherein after performing the first set of conversions to generate the first output sample, the method further comprises: resetting the offset-compensated decimation filter by clearing the offset error before starting a second set of conversions to generate a second output sample; and generating a second offset-compensated decimation filter configured for the second set of conversions.

Example 13. The method according to example 11 or 12, wherein performing the set of conversions to generate the output sample further includes: receiving the input voltage and a feedback voltage at the integrator; applying an integrator output to the quantizer to generate an oversampling sample, the oversampling sample including the offset error added by the quantizer; applying the oversampling sample to the offset-compensated decimation filter, the offset-compensated decimation filter subtracting the offset error added by the quantizer from the oversampling sample; and accumulating the oversampling sample in the decimation filter, which is configured to accumulate oversampling samples generated by the conversions other than the first conversion.

Example 14. The method according to example 13, wherein: the first conversion of the set of conversions does not include the integrator to generate the dummy sample; and the conversions other than the first conversion of the set of conversions includes the integrator to generate the oversampling samples.

Example 15. The method according to example 14, further comprising: the output sample is based on the oversampling samples and is not based on the dummy sample.

Example 16. The method according to any one of examples 11 to 15, wherein the method further includes:

adding a pedestal voltage as negative feedback to the input of the sigma-delta ADC at a start of each conversion of the set of conversions.

Example 17. A sigma-delta ADC comprising: a sigma-delta modulator including: an integrator configured to store a difference between an input voltage and a feedback voltage; and a quantizer configured to generate an oversampling sample based on an integrator-output voltage of the integrator, the oversampling sample including an offset error; a decimation filter coupled to an output of the sigma-delta modulator and configured to receive the oversampling sample from the quantizer; and control logic configured by instructions and/or logic circuitry to: configure the sigma-delta modulator to perform a set of conversions to generate an output sample; replace, for a first conversion of the set of conversions, the input voltage with a zero voltage; and decouple, for the first conversion of the set of conversions, the decimation filter from the quantizer so that the feedback voltage from the output of the quantizer is an offset voltage corresponding to the offset error, the offset voltage being stored in the integrator.

Example 18. The sigma-delta ADC according to example 17, wherein the control logic is further configured to: replace the zero voltage with the input voltage for subsequent conversions of the set of conversions; and recouple the decimation filter to the output of the quantizer for the subsequent conversions, the decimation filter configured to output an output sample based on oversampling samples generated by the subsequent conversions.

Example 19. The sigma-delta ADC according to example 17 or 18, wherein: the set of conversions is a first set of conversions and the output sample is a first output sample, and the control logic is further configured by the instructions and/or the logic circuitry to: reset the offset voltage stored in the integrator after outputting the first output sample and before starting a second set of conversions.

Example 20. The sigma-delta ADC according to any one of examples 17 to 19, wherein the control logic is further configured by the instructions and/or the logic circuitry to: add a pedestal voltage to the zero voltage during the first conversion of the set of conversions; and not add the pedestal voltage to the input voltage during subsequent conversions of the set of conversions after the first conversion.

Example 21. The sigma-delta ADC according to any one of examples 17 to 20, wherein: the first conversion of the set of conversions generates a dummy sample, which is not accumulated by the decimation filter to generate an output sample; and subsequent conversions of the set of conversions after the first conversion generate oversampling samples, which are accumulated by the decimation filter to generate the output sample.

Example 22. A sigma-delta ADC comprising: a sigma-delta modulator including: an integrator configured to store a difference between an input voltage and a feedback voltage; a quantizer configured to generate an oversampling sample based on an integrator output voltage, the oversampling sample including an offset error; and a digital-to-analog converter in a feedback loop of the sigma-delta modulator, the digital-to-analog converter configured to convert the oversampling sample into the feedback voltage; a decimation filter coupled to an output of the sigma-delta modulator and configured to receive the oversampling sample from the quantizer; and control logic configured by instructions and/or logic circuitry to: configure the sigma-delta modulator to perform a set of conversions; replace, for a first conversion of a set of conversion, the input voltage with a zero voltage; bypass the integrator for the first conversion of the set of conversions so that the quantizer generates a dummy sample based on the zero voltage, the dummy sample including the offset error; and configure the decimation filter to store the offset error to compensate for offset errors added by the quantizer during subsequent conversions of the set of conversions.

Example 23. The sigma-delta ADC according to example 22, wherein the control logic is further configured to: replace the zero voltage with the input voltage for the subsequent conversions; and recoupling the integrator to store the difference between the input voltage and the feedback voltage for the subsequent conversions.

Example 24. The sigma-delta ADC according to example 22 or 23, wherein: the set of conversions is a first set of conversions, and the control logic is further configured by the instructions and/or the logic circuitry to: reset the offset error stored in the decimation filter after outputting a first output sample and before starting a second set of conversions.

Example 25. The sigma-delta ADC according to any one of examples 22 to 24, wherein the set of conversions is a first set of conversion and the control logic is further configured by the instructions and/or the logic circuitry to: add a pedestal voltage to the zero voltage during the first conversion and during the subsequent conversions; and add the pedestal voltage to the input voltage during the subsequent conversions.

Example 26. The sigma-delta ADC according to any one of examples 22 to 25, wherein: the first conversion of the set of conversions generates the dummy sample, which is not accumulated by the decimation filter to generate an output sample; and the subsequent conversions of the set of conversions after the first conversion generate oversampling samples, which are accumulated by the decimation filter to generate the output sample.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

The invention claimed is:

1. A method for compensating for an offset voltage in a sigma-delta ADC, the method comprising:
   replacing an input voltage for a first conversion of a set of conversions, at an input of the sigma-delta ADC, with a reference voltage;
   quantizing the reference voltage, at a quantizer of the sigma-delta ADC, to obtain a dummy sample, the dummy sample including the offset voltage added by the quantizer of the sigma-delta ADC;
   decoupling a decimation filter of the sigma-delta ADC;
   generating a feedback voltage, corresponding to the dummy sample, the feedback voltage including the offset voltage;
   inverting the feedback voltage to generate an inverted feedback voltage;
   applying the inverted feedback voltage to an integrator of the sigma-delta ADC, the inverted feedback voltage including an inverted offset voltage; and
   storing the inverted offset voltage in the integrator to generate an offset-charged integrator.

2. The method according to claim 1, wherein:
   the set of conversions are performed to generate an output sample; and
   for conversions other than the first conversion of the set of conversions, the inverted offset voltage added by the offset-charged integrator cancels the offset voltage added by the quantizer while generating the output sample.

3. The method according to claim 2, wherein the set of conversions is a first set of conversions and the output sample is a first output sample, and wherein after performing the first set of conversions to generate the first output sample, the method further comprises:
   resetting the offset-charged integrator by clearing the inverted offset voltage before starting a second set of conversions to generate a second output sample; and
   generating a second offset-charged integrator for the second set of conversions.

4. The method according to claim 3, wherein performing the set of conversions to generate the output sample further includes:
   receiving the input voltage at the input of the sigma-delta ADC;
   applying the input voltage to the offset-charged integrator;
   applying an integrator output of the offset-charged integrator to the quantizer, the integrator output including the inverted offset voltage to cancel the offset voltage added by the quantizer;
   generating an oversampling sample, the oversampling sample having no offset error; and
   applying the oversampling sample to the decimation filter.

5. The method according to claim 2, wherein:
   the first conversion of the set of conversions is the dummy sample, which is not accumulated by the decimation filter; and
   the conversions other than the first conversion of the set of conversions are oversampling samples that are accumulated by the decimation filter.

6. The method according to claim 5, wherein:
   storing the inverted offset voltage stored in the integrator is based on the dummy sample and not the oversampling samples.

7. The method according to claim 5, further comprising:
   outputting the output sample corresponding to the input voltage at an output of the decimation filter is based on the oversampling samples and not the dummy sample.

8. The method according to claim 1, wherein for the first conversion of the set of conversions, the method further includes:
   adding a pedestal voltage to the reference voltage; and
   storing the pedestal voltage in the integrator with the inverted offset voltage.

9. The method according to claim 8, further comprising:
   not adding the pedestal voltage to conversions other than the first conversion of the set of conversions.

10. The method according to claim 1, wherein the reference voltage is zero volts.

11. A method for compensating for an offset error in a sigma-delta ADC:
    performing a set of conversions to generate an output sample, wherein for a first conversion of the set of conversions, the method includes:

replacing an input voltage at an input of the sigma-delta ADC with a reference voltage;

bypassing an integrator of the sigma-delta ADC;

quantizing the reference voltage, at a quantizer of the sigma-delta ADC, to obtain a dummy sample, the dummy sample including the offset error added by the quantizer of the sigma-delta ADC; and applying the dummy sample to a decimation filter configured to store the offset error to generate an offset-compensated decimation filter, the offset-compensated decimation filter configured to subtract the offset error added by the quantizer of the sigma-delta ADC for conversions other than the first conversion of the set of conversions.

12. The method according to claim 11, wherein the set of conversions is a first set of conversions an the output sample is a first output sample, and wherein after performing the first set of conversions to generate the first output sample, the method further comprises:

resetting the offset-compensated decimation filter by clearing the offset error before starting a second set of conversions to generate a second output sample; and generating a second offset-compensated decimation filter configured for the second set of conversions.

13. The method according to claim 11, wherein performing the set of conversions to generate the output sample further includes:

receiving the input voltage and a feedback voltage at the integrator;

applying an integrator output to the quantizer to generate an oversampling sample, the oversampling sample including the offset error added by the quantizer;

applying the oversampling sample to the offset-compensated decimation filter, the offset-compensated decimation filter subtracting the offset error added by the quantizer from the oversampling sample; and accumulating the oversampling sample in the decimation filter, which is configured to accumulate oversampling samples generated by the conversions other than the first conversion.

14. The method according to claim 13, wherein:

the first conversion of the set of conversions does not include the integrator to generate the dummy sample; and the conversions other than the first conversion of the set of conversions includes the integrator to generate the oversampling samples.

15. The method according to claim 14, further comprising:

the output sample is based on the oversampling samples and is not based on the dummy sample.

16. The method according to claim 11, wherein the method further includes:

adding a pedestal voltage as negative feedback to the input of the sigma-delta ADC at a start of each conversion of the set of conversions.

17. A sigma-delta ADC comprising:

a sigma-delta modulator including:

an integrator configured to store a difference between an input voltage and a feedback voltage; and a quantizer configured to generate an oversampling sample based on an integrator-output voltage of the integrator, the oversampling sample including an offset error;

a decimation filter coupled to an output of the sigma-delta modulator and configured to receive the oversampling sample from the quantizer; and control logic configured by instructions and/or logic circuitry to:

configure the sigma-delta modulator to perform a set of conversions to generate an output sample;

replace, for a first conversion of the set of conversions, the input voltage with a zero voltage; and decouple, for the first conversion of the set of conversions, the decimation filter from the quantizer so that the feedback voltage from the output of the quantizer is an offset voltage corresponding to the offset error, the offset voltage being stored in the integrator.

18. The sigma-delta ADC according to claim 17, wherein the control logic is further configured to:

replace the zero voltage with the input voltage for subsequent conversions of the set of conversions; and recouple the decimation filter to the output of the quantizer for the subsequent conversions, the decimation filter configured to output the output sample based on oversampling samples generated by the subsequent conversions.

19. The sigma-delta ADC according to claim 17, wherein the control logic is further configured by the instructions and/or the logic circuitry to:

add a pedestal voltage to the zero voltage during the first conversion of the set of conversions; and not add the pedestal voltage to the input voltage during subsequent conversions of the set of conversions after the first conversion.

20. The sigma-delta ADC according to claim 17, wherein:

the first conversion of the set of conversions generates a dummy sample, which is not accumulated by the decimation filter to generate the output sample; and subsequent conversions of the set of conversions after the first conversion generate oversampling samples, which are accumulated by the decimation filter to generate the output sample.

* * * * *